(12) United States Patent
van Veldhoven

(10) Patent No.: US 8,269,660 B2
(45) Date of Patent: Sep. 18, 2012

(54) ANALOG TO DIGITAL CONVERSION CIRCUIT AND METHOD

(75) Inventor: Robert Hendrikus Margaretha van Veldhoven, Dommelen (NL)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 12/956,220

(22) Filed: Nov. 30, 2010

(65) Prior Publication Data

US 2011/0128176 A1    Jun. 2, 2011

(30) Foreign Application Priority Data

Nov. 30, 2009  (EP) .................................... 09177522

(51) Int. Cl.
*H03M 1/12*          (2006.01)
(52) U.S. Cl. ......... 341/155; 341/143; 341/156; 341/160
(58) Field of Classification Search .................. 341/155, 341/156, 143, 160
See application file for complete search history.

(56) References Cited

U.S. PATENT DOCUMENTS

| | | |
|---|---|---|
| 4,998,109 A | 3/1991 | Lechevalier |
| 2006/0187099 A1* | 8/2006 | Fujimoto ...................... 341/143 |
| 2009/0153388 A1* | 6/2009 | Waltari et al. ................. 341/160 |

OTHER PUBLICATIONS

Extended European Search Report for European Patent Appl. No. 09177522.1 (May 19, 2010).

* cited by examiner

*Primary Examiner* — Jean B Jeanglaude

(57) ABSTRACT

Disclosed is a circuit for converting an analog input signal into a digital code ($b_1$-$b_N$), comprising a delay circuit adapted to generate a periodical signal having a delay as a function of the analog input signal value; and a quantization stage for converting the delayed periodical signal into the digital code. The circuit converts an analog voltage or current into the time-domain, thus facilitating the implementation of high-speed analog-to-digital converters into submicron technologies, in particular CMOS technologies. A method of converting an analog input signal into a digital code ($b_1$-$b_N$) is also disclosed.

15 Claims, 4 Drawing Sheets

ANALOG TO DIGITAL CONVERSION CIRCUIT AND METHOD

CROSS-REFERENCE TO RELATED APPLICATIONS

This application claims the priority under 35 U.S.C. §119 of European patent application no. 09177522.1, filed on Nov. 30, 2009, the contents of which are incorporated by reference herein.

FIELD OF THE INVENTION

The present invention relates to a circuit for converting an analog input signal into a digital code.

The present invention further relates to a method of converting an analog input signal into a digital code.

BACKGROUND OF THE INVENTION

Analog-to-digital converters (ADCs) form an integral part of many electronic devices comprising digital signal processors (DSPs) in which an analog input signal is (down)converted into a digital signal for further processing. Examples of such electronic devices include video processing devices, mobile telecommunication devices, and so on.

Figure 1:
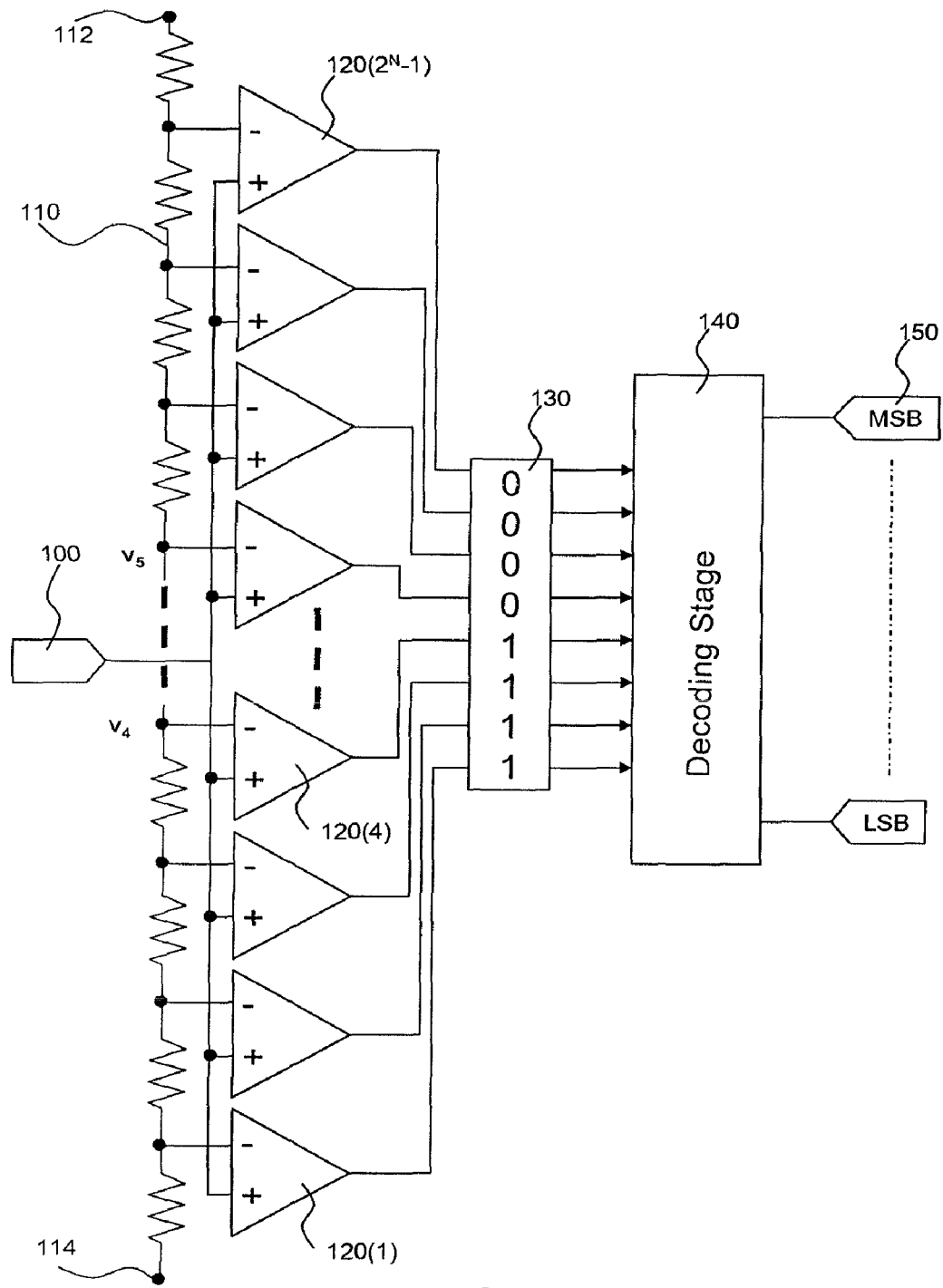

Many of such devices require high-speed conversion of the analog input signal, as for instance is the case for streaming video processing. A well-known example of a high speed ADC is the flash ADC, which is schematically depicted in FIG. 1. The N-bit flash ADC in FIG. 1 has an analog input 100 that is fed to the respective inputs of $2^N-1$ comparators 120 that further receive a reference voltage on their other input generated by a resistive divider or ladder 110 connected between an upper reference voltage 112 and a lower reference voltage 114. The comparators 120 are typically clocked to sample the analog input at given points in time, i.e. at the edges of the clock signal. This is also known as the sampling rate of the ADC.

The reference voltage for each comparator is one least significant bit (LSB) greater than the reference voltage for the comparator immediately below ft. Each comparator produces a "1" when its analog input voltage is higher than the applied reference voltage. Otherwise, the comparator output is "0". Thus, if the analog input is between reference voltages $v_4$ and $v_5$, comparators 120(1) up to and including 120(4) produce "1"s and the remaining comparators produce "0"s.

The point where the code changes from ones to zeros is the point where the input signal becomes smaller than the respective comparator reference voltage levels. This is known as thermometer code encoding. The thermometer code is decoded into the appropriate digital bit pattern 150 by a decoder 140.

The comparators 120 may form a cascade of wideband low gain stages. These stages are low gain because at high sampling frequencies it is difficult to achieve both wide bandwidth as well as high gain. The comparators 120 are designed for low voltage offset, such that the input offset of each comparator is much smaller than a least significant bit (LSB) of the flash ADC. This reduces the risk that the offset could falsely trip the comparator 120, resulting in a digital output code not representative of a thermometer code. A regenerative latch 130 may be used to store the clocked comparator results.

However, the ongoing miniaturization of electronic circuits such as DSPs makes it increasingly difficult to implement a flash ADC in modern IC technologies, due to the relatively large area required for the flash ADC. For instance, the flash ADC uses an area intensive reference ladder 110 to generate accurate reference voltages, and requires $2^N-1$ comparators to implement an N-bit ADC, which practically limits the ADC to an upper limit of 8 bits.

In addition, the offset of the comparators 120 has to be reduced due to the reducing supply voltages in new sub-micron-technologies, causing a reduction of the magnitude of the LSB voltage. The offset shifts the decision level of the comparator 120, which gives the flash ADC a non-linear amplitude quantizing transfer function. In the particular case where two consecutive comparators have an inverted offset greater than 0.5 LSB, the flash ADC loses its monotonicity.

The offset of the comparators 120 can be reduced in two ways. Firstly, the area of the input pair may be increased. Increasing the area of the input pairs of the comparators 120 increases their matching and reduces the spread on the comparator decision level. However, the area increase is undesirable. Moreover, this area increase reduces the speed of the comparators 120, which therefore is contradictory to the high-speed requirements of the flash ADC.

Alternatively, offset calibration techniques may be used. This however comes at the expense of a significant increase of the design complexity of the flash ADC, which increases the design time and risk, and thus cost of the ADC.

SUMMARY OF THE INVENTION

The present invention seeks to provide a high-speed ADC that can be integrated into sub-micron technologies in a cost-effective manner.

The present invention further seeks to provide a method for converting an analog input into a digital code in a cost-effective manner.

In accordance with a first aspect, there is provided a circuit for converting an analog input signal into a digital code, comprising a delay circuit adapted to generate a periodical signal having a delay as a function of the analog input signal value; and a quantization stage for converting the delayed periodical signal into the digital code.

The present invention is based on the realization that in high speed application such as digital CMOS technologies, the analog signal value can be used to control an amount of delay to a periodical signal such as a clock signal. In other words, the present invention is based on a conversion of an analog voltage or current signal into the time domain rather than into the voltage domain as done by state of the art flash ADCs using a resistor ladder to generate the different voltages. By capturing this amount of delay in the digital domain, the delay can be translated into a digital code such as a thermometer code. This approach for instance has the advantage that a much smaller ADC is achieved due to the fact that the use of an area-consuming resistor ladder is no longer required.

Preferably, the circuit further comprises a decoding stage for decoding the digital code into a bit pattern, e.g. binary coding.

In an embodiment, the quantization stage comprises a further delay circuit adapted to receive a further periodical signal having a known phase relationship with the periodical signal as an input and comprising a plurality of serially connected delay stages each adapted to produce an incrementally delayed version of the further periodical signal; and a capture circuit having a plurality of capture stages responsive to the delayed periodical signal, each capture stage being arranged to receive a respective one of said incrementally delayed versions of the further periodical signal.

The analog-signal induced delay to the periodical signal may be quantized by providing a further periodical signal having a known phase relationship with the periodical signal, such as two clock signals that may be provided by the same clock or by different clocks having a known phase relation. The generation of delayed instances of the further periodical signal allows for the determination of the digital code. This is because the capture stages take a snapshot, i.e. a sample, of the state of the delay stages, upon being triggered by the delayed periodical signal, thus showing how many delay stages have generated the delayed version of the further periodical signal, which equates to a digital code since a delay stage either has or has not yet produced the incrementally delayed version of the further periodical signal. As with the reducing foot print of digital circuits delay elements can be produced having a high resolution, i.e. that can produce very short delays, a high speed ADC can be achieved.

The further delay circuit may be a delay-locked loop (DLL) further comprising a phase detector comprising a first input for receiving the further periodical signal and a second input for generating the incrementally delayed version of the further periodical signal from the final stage of the plurality of serially connected delay stages, said phase detector being arranged to generate a control signal for controlling the plurality of serially connected delay stages from the phase relationship between the respective signals on its first input and second input. This ensures that the phase relationship between the periodical signal and its incrementally delayed counterparts produced in the delay stages is well-maintained, thus guaranteeing a highly accurate ADC reference.

In an embodiment, the delay circuit comprises a chain of serially connected delay stages for producing the delayed periodical signal, each stage being controlled by a further control signal, said further control signal comprising the analog input signal. Similar to controlling the delay stages in a DLL as a function of a phase mismatch between a signal to be delayed and its delayed counterpart, the amount of the delay introduced by the delay stages in this chain can be controlled by the magnitude of the analog input signal used as a control signal for these delay stages. Consequently, the capture stages, which typically respond to the edges of the delayed periodical signal, capture the state of the delay stages in the further delay circuit at different points in different periods, e.g. a clock cycle.

In an embodiment, the further control signal comprises the control signal modulated by the analog input signal. This has the advantage that the phase relationship between the periodical signal and the further periodical signal is well-maintained.

In an embodiment, the number of delay stages in the delay circuit is half the number of delay stages in the delay locked loop. This has the advantage that at half of the theoretically maximum delay introduced by the delay circuit to the periodical signal, half the delay stages in the further delay circuit have generated an incrementally delayed version of the further periodical signal, thus ensuring that the full range of the analog signal can be captured in digital code.

The delay locked loop may be adapted to delay the further periodical signal by an integer number of periods, and the delay circuit may be adapted to delay the periodical signal by the integer number of periods in response to the analog input signal having a maximum value.

In another embodiment, each capture stage comprises a comparator for comparing the respective one of said incrementally delayed versions of the further periodical signal with the delayed periodical signal, which is similar to how conventional flash ADCs generate the digital code. This thus has the advantage that standard library cells may be used for the design of the ADC of the present invention. Such comparators may be analog comparators, as well as digital comparators, e.g. logic gates such as AND gates.

In an alternative embodiment, each capture stage comprises a data storage element responsive to the delayed periodical signal. Because the delay stages of the further delay circuit effectively produce a digital signal as an output, instead of comparing these signals with a reference signal generated by the delay circuit, the may be directly captured into sequential data storage elements, such as a multi-bit latch or a series of flip-flops, which reduces the foot print of the ADC as the comparators may be omitted from the design. The data storage elements may be provided with a positive feedback to ensure that a stable input value is captured in case the corresponding delay stages of the further delay circuit are in the process of reproducing an edge of the further periodical signal or display a fluctuation in their outputs for another reason.

The circuit of the present invention may be advantageously incorporated into an electronic device such as an integrated circuit or a device comprising such an electronic circuit, such as a video signal processing device, a mobile communication device, a computing device and so on.

In accordance with another aspect of the present invention, there is provided a method of converting an analog input signal into a digital code, comprising delaying a periodical signal as a function of the analog input signal value; and converting the delayed periodical signal into the digital code. This method is based on the conversion of an analog signal into the time domain as previously explained, which has the advantage that high speed analog-to-digital conversion using a relatively small and simple circuit can be achieved.

Preferably, said converting step comprises generating a plurality of incrementally delayed versions of a further periodical signal having a known phase relationship with the periodical signal, and capturing the generated incrementally delayed versions in response to the delayed periodical signal. This allows for a straightforward generation of the digital code, as it corresponds to the number of incrementally delayed versions generated at the time of capture.

BRIEF DESCRIPTION OF THE EMBODIMENTS

Figure 2:
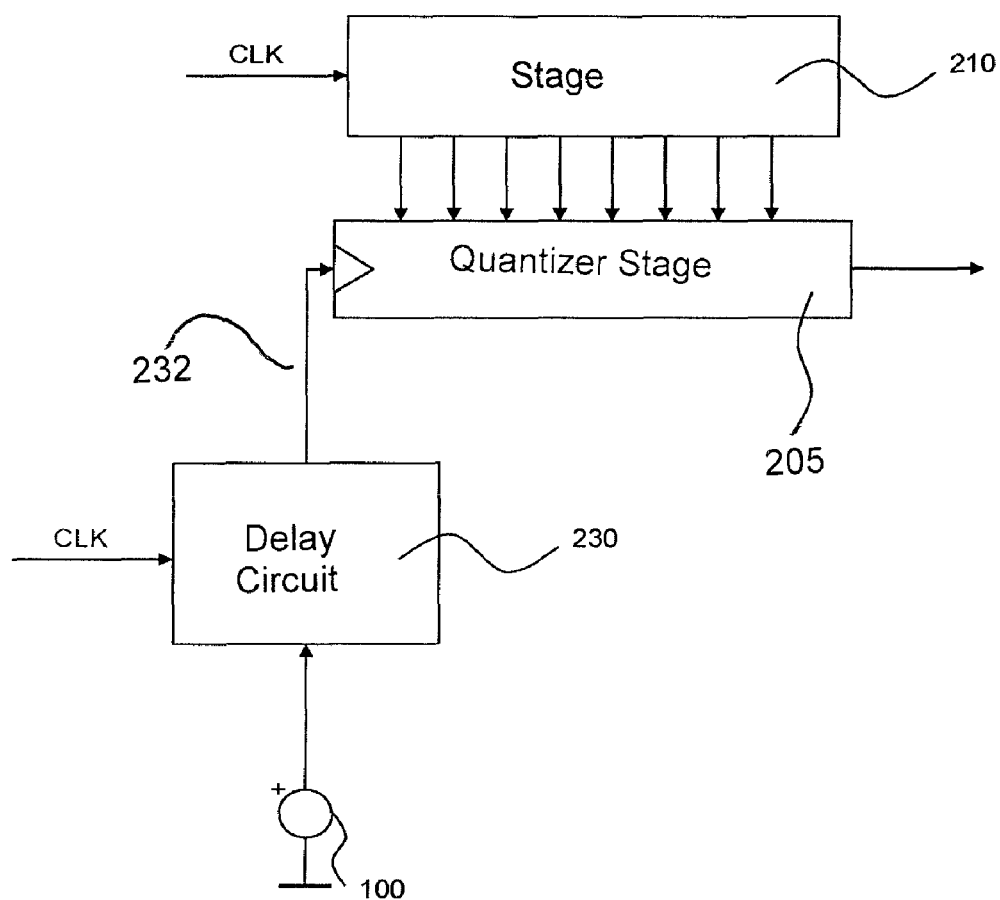
Figure 3:
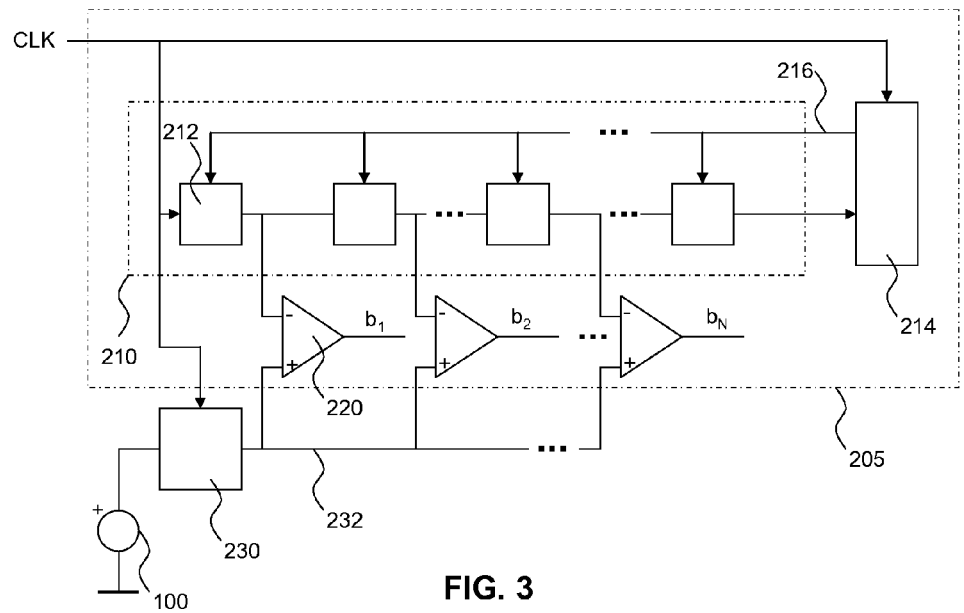
Figure 4:
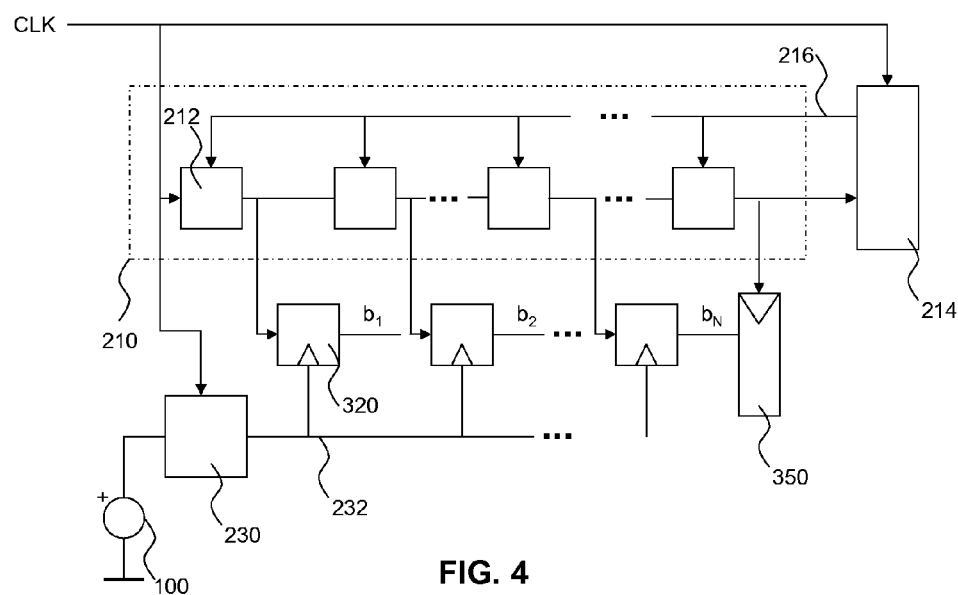
Figure 5:
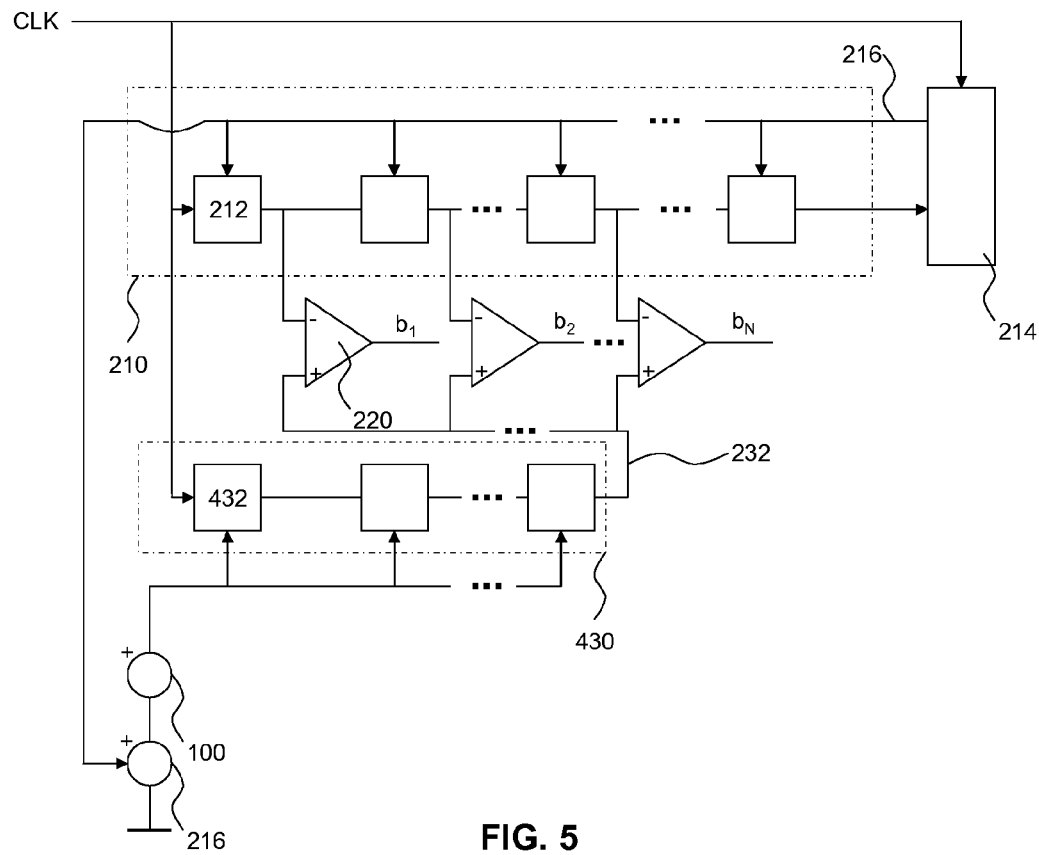
Figure 6:
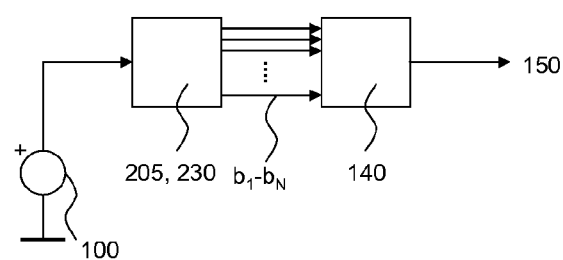

Embodiments of the invention are described in more detail and by way of non-limiting examples with reference to the accompanying drawings, wherein FIG. 1 schematically depicts a prior art flash ADC;

FIG. 2 schematically depicts the general concept of the ADC according to the present invention;

FIG. 3 schematically depicts an aspect of an ADC in accordance with an embodiment of the present invention;

FIG. 4 schematically depicts an aspect of an ADC in accordance with another embodiment of the present invention;

FIG. 5 schematically depicts an aspect of an ADC in accordance with yet another embodiment of the present invention; and FIG. 6 schematically depicts another aspect of an ADC in accordance with an embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

The present invention is based on the insight that analog to digital conversion may be performed in the time domain rather than in the voltage domain. It is known to generate a time-variant signal in the digital domain, such as for instance the output of a clock-triggered counter or by delaying a periodic signal such as a clock signal as a function of a signal value. This principle is for instance utilized in a DLL, where the amount of phase mismatch between an input clock signal and its delayed version generated in the delay line of the DLL is used to drive a charge pump, which output is used as the control signal for the switches in the delay stages of the delay line of the DLL. Hence, the amount of delay introduced to the clock signal depends on the strength of the control signal produced by the charge pump.

It has been realized that this principle may also be used to delay a periodical signal such as a clock signal using an analog input signal as a control signal, wherein the strength or value of the analog input signal controls the amount of delay that is introduced into the periodical signal. This delay can be quantized in the digital domain by generating a time-varying signal as described above that represents a digital code that periodically changes its value, and capturing the actual value of the digital code using a capturing stage that is controlled by the delayed periodical signal.

This principle is schematically depicted in FIG. 2. The stage 210 generates a plurality of signals representing a digital code, which periodically changes value. A delay circuit 230 also generates a delay to a periodical signal 232, with the amount of the delay being a function of the value of an analog signal 100 to which the delay circuit 230 is responsive. The delayed periodical signal 232 is used to trigger a capture of the actual value of the digital code, such that the digital code corresponds to the amount of delay introduced to the periodical signal 232 by the delay circuit 230. Hence, different values of the analog signal 100 are converted to different digital codes by discrimination in the time-domain as opposed to the voltage domain in conventional flash ADCs.

It will be appreciated that it is important that the initial value of the digital code is appropriately synchronized with periodical signal that is manipulated by the delay circuit 230 to ensure that the captured value of the digital code accurately corresponds to the value of the analog signal triggering the capture event. This may for instance be achieved by controlling the generation of the digital code using a further periodical signal that has a known phase relationship with the periodical signal. For instance, the periodical signal and the further periodical signal may be the same signal, such as the same clock signal, although it should be understood that different periodical signals having a well-established phase relationship may also be used.

FIG. 3 schematically depicts an embodiment of the circuit of the present invention, in which the analog input signal 100 is used to control a delay circuit 230. The delay circuit 230 may be considered a voltage-to-time converter in case of an analog input signal 100 having a variable voltage, and may be considered a current-to-time converter in case of an analog input signal 100 having a variable current. The delay circuit 230 receives an input clock signal CLK and is responsive the analog input signal 100 in that it is configured to delay this input clock signal by an amount that corresponds to the voltage or current value of the analog input signal 100.

In the digital domain, this delay is quantized using a quantization stage 205 that periodically updates a digital code and captures the up-to-date value of the digital code upon receiving the delayed version of the periodical signal, e.g. the clock signal CLK, as produced by the delay circuit 230 on its output. In FIG. 3, the quantization stage 205 comprises a further delay circuit implemented as a DLL including a delay line 210 comprising a plurality of serially connected delay stages 212 and a phase detector 214. The delay line 210 receives a further periodical signal having a known phase relationship with the periodical signal provided to the delay circuit 210. Preferably, the further periodical signal and the periodical signal are instances of the same signal, which, in FIG. 3, is the clock signal CLK.

Since the operation of a DLL is well-known, it will only be briefly explained for the sake of brevity only. The number n of delay stages 212 in the delay line 210 is chosen such that the total delay introduced by the n delay stages corresponds to an integer number C of periods, i.e. clock cycles in the given example. In phase, each delay stage 212 introduces a delay of $C*T_{CLK}/n$ to the clock signal, in which $T_{CLK}$ defines the undelayed clock signal. In order to bring the output of the delay line 210 into phase with the clock signal CLK, the phase detector 214 determines the phase difference between the undelayed clock signal CLK and the output of the delay line 210 and generates a control signal 216 indicative of the determined phase difference to adjust the delay in the delay stages 212 until the overall delay of the delay line 210 corresponds to C, i.e. until the output of the delay line 210 is in phase with the input clock signal CLK.

Many different implementations of delay stages 212 are readily available to the skilled person, as DLLs have been known for many years. For this reason, the implementation details of the delay stages will not be further discussed for reasons of brevity only. It suffices to say that any suitable delay stage design may be used.

In the embodiment shown in FIG. 3, a number of delay stages 212 have their outputs connected to the respective inputs of comparators 220 of a capture circuit of the quantization stage 205. The number of delay stages 212 and corresponding capture circuits 220 typically corresponds to the bit length of the digital code to be generated. In an embodiment, all delay stages 212 have their respective outputs connected to a capture circuit 220, although any number of delay stages 212, i.e. a number smaller than the total number of delay stages 212 in the delay line 210 may be chosen.

In FIG. 3, the comparators 220, which may be analog or digital compators, receive the delayed periodic signal 232 on their other input, and generate one bit of an N-bit digital code on their outputs, as indicated by the labels $b_1$-$b_N$. The outputs $b_1$-$b_N$ are typically fed to a capture circuit such as a latch (not shown), which is also responsive to the edge of the delayed periodic signal 232 such that the digital code corresponding to the analog input signal 100 is sampled as defined by the edge of the delayed clock signal 232. It will be understood that it may be necessary to subsequently synchronize the capture circuit with the clock signal(s) controlling the subsequent signal processing stages that process the digital codes. Any suitable synchronization technique may be used for this purpose.

In operation, the clock signal CLK will be received simultaneously (or with a known phase difference) by the delay line 210 and the delay circuit 230. The delay stages 212 in the delay line effectively generate delayed versions of the clock signal CLK such that the edge of the clock signal can be seen to ripple through the delay line 210 as a function of time. At the same time, the delay circuit 230 delays the edge of the clock signal CLK by an amount of time that is dictated by the value of the analog signal 100. Upon the delay circuit 230 producing the delayed version 232 of the clock signal CLK, or to be more precise, an edge of the delayed clock signal 232, the comparators 220 compare the contents of the delay stages 212 with the value of the delayed clock signal 232, i.e. a high state or a low state.

This will be explained in more detail using a non-limiting example in which N=4. The delay circuit 230 is configured to introduce a delay that depends on the value of the analog input signal 100. This signal may for instance vary from −V to +V. At −V, the delay circuit 230 will introduce a minimal amount of delay only to the clock signal CLK such that the output signal 232 is a substantially undelayed version of the clock signal CLK and none of the delay elements 212 have yet produced a delayed version of their input signal, whereas at +V, the delay circuit 230 will add the maximum allowable delay to the clock signal CLK such that all delay elements 212 connected to a comparator 220 will have produced a delayed version of the input signal of the delay line 210.

Hence, for an analog input signal 100 of value −V, none of the delay stages 212 will yet have produced a delayed version of the clock signal CLK, such that all comparators 220 capture the same state from the delay stages 212, and therefore produce the same output bit value, e.g. a digital code 0000. For an analog input signal 100 of value +V, all of the delay stages 212 will have produced a delayed version of the clock signal CLK, such that all comparators 220 capture the same state from the delay stages 212, and therefore produce the same output bit value, e.g. a digital code 1111. For an intermediate value of the analog input signal 100, e.g. 0V, the first half of the delay stages 212 will have produced a delayed version of the clock signal CLK, such that the comparators 220 produce a digital code 1100. It will be understood that this way, a full thermometer code may be generated for the various values of the analog input signal 100.

At this point, it is emphasized that in FIG. 3, the further delay circuit of the quantization stage 205 has been implemented as a DLL by way of non-limiting example only. Other implementations are also feasible, such as an N-bit counter which is responsive to a local clock or oscillator having a frequency of $N*f_{CLK}$, with $f_{CLK}$ being the frequency of the clock provided to the delay circuit 230. In this embodiment, the counter value may be captured as the digital code upon the delay circuit 230 producing the delayed clock signal 230. A selected edge of the periodical signal fed to the delay circuit 230 may be used to reset the N-bit counter. In another embodiment, the digital code generated by the counter may be the actual bit pattern, thus obviating the need for an additional decoding stage, which has the further advantage of a reduction in area of the ADC as the ADC does not require $2^N-1$ stages to generate a $2^N-1$ codeword to decode an N-bit bit pattern, but requires an N-bit counter only.

Alternatively, an N-bit shift register may be provided into which periodically a fixed logic value, e.g. a logic '1' is inserted, thus representing the construction of a thermometer code. The shift register will be reset or initialized by the undelayed clock signal to contain complementary logic values only, e.g. all logic '0's. Other suitable examples of a circuit for generating such a periodically updated digital code will be apparent to the skilled person.

FIG. 4 shows an alternative embodiment of an ADC according to the present invention, in which the comparators 220 of the quantization stage 205 are replaced by data storage elements 320, e.g. flip-flops or latches. The control (capture) terminals of the data storage elements 320 are connected to the output of the delay circuit 230; i.e. are responsive to an edge of the delayed periodical signal 232. This has the advantage that a more compact ADC is achieved because no additional capture latch is required. The data storage elements 320 may provide the digital code directly to further processing means (not shown) such as a thermometer code decoder for converting the digital code into a bit pattern.

This embodiment is particularly suitable for use with a further delay circuit producing stable digital values, such as an N-bit counter. Nevertheless, the data storage elements 320 may also be used in combination with a DLL. Each data storage element 320 may be provided with a positive feedback loop (not shown) to ensure that a stable value is captured from the further delay circuit. In order to synchronize the outputs of the data storage elements 320 with the undelayed clock signal of subsequent processing circuits (not shown), a synchronization latch 350 may be provided that is adapted to capture the outputs b1-bN under control of the undelayed clock signal, e.g. as provided by the output of the final delay stage 212 of the delay line 210, which produces a clock signal that is delayed by an integer number of cycles, which equates to an undelayed clock signal.

FIG. 5 shows another alternative embodiment of the ADC according to the present invention, in which the delay circuit responsive to the analog signal 100 has been implemented as a delay line or delay chain 430 comprising a plurality of serially connected delay stages 432, with the output of the delay line 430 producing the delayed periodical signal 232, i.e. the delayed clock signal 232 in FIG. 4. The delay stages 432 are controlled by the control signal 216 generated by the phase comparator 214, which is modulated by the addition of the analog input signal 100, as shown in FIG. 5.

In an embodiment, the delay stages 432 have the same design as the delay stages 212, with the delay line 210 having twice as many delay stages 212 coupled to respective comparators 220 than there are delay stages 432 in the delay chain 430. This is for instance an advantageous embodiment for an ADC in which the value of the analog input signal 100 can vary from −V to +V, as this assures that when the analog input signal 100 has a value of 0V, the delay of the delay line 430 is half that of the delay line 210 such that half the delay stages 212 have produced a delayed further periodical signal upon the generation of the delayed edge of the periodical signal 232 by the delay chain 430. Obviously, the ADC may be configured to process analog input signals 100 in any given range, e.g. from any minimum voltage $V_{min}$ to any maximum voltage $V_{max}$.

At this stage, it is reiterated that the digital code generated by the further delay circuit, i.e. the DLL and comparators 220 in FIG. 4 does not necessarily have to be a thermometer code. For instance, the delay stages 212 may be designed to have an intrinsic delay that is half the amount of the delay introduced by the delay stages 432 when exposed to the control signal 216 only. Such variations in delay times can be achieved in many suitable ways, as will be apparent by the skilled person, for instance by varying the transistor dimensions of the transistors forming these delay stages.

In the thus far described embodiments, a thermometer code has been generated in which only the first edge of the input clock CLK of the delay line 210 has been used to generate the digital code. This has the advantage that the duty cycle of the clock does not have to be tightly controlled as long as the duty cycle is at least 50%. However, for well-defined clock signals having a near-perfect duty cycle, it is possible to utilize both edges of the clock signal, as will be explained in more detail below.

In an arrangement in which the delay line 210 comprises the same number of delay stages coupled to respective comparators 220 than there are delay stages 432, this has the consequence that a thermometer code is counted up, and subsequently counted down again in case the delay stages 212 and 432 are of identical design. This can be understood by the example of the analog input signal having a value of 0V, in which case the identical delay stages 212 and 432 are being controlled by an identical signal, i.e. control signal 216 only, such that upon the circuit 430 generating the delayed signal 232, all delay stages 212 will have produced a delayed version of the edge of the input clock signal of the delay line 210. In other words, all delay stages 212 produce a high signal at that point.

Hence, in this embodiment, both the positive edge and the negative edge of the clock signal CLK are being considered in the interpretation of the outputs of the delay line 210 that are fed to the comparators 220. In this embodiment, as previously explained, it is important that the duty cycle of the input clock signal CLK does not significantly deviate from 50% to ensure that the countdown of the thermometer code is started at the correct point in time.

For example, for a 4-bit thermometer code, the following set of eight codes would be generated depending on the value of the analog input signal 100: {0000, 1000, 1100, 1110, 1111, 0111, 0011, 0001}. More generally, a N-bit code would generate a total of 2N codes as opposed to the N+1 codes conventional N-bit thermometer codes generate. This has advantageous implications for the overall size of the ADC as the number of required code bits for coding an N-bit bit pattern is $2^{N-1}$ rather than $2^N-1$ for conventional thermometer code-based designs, thus yielding an area saving of almost 50%.

This concept may be varied in many ways. For instance, if the capture circuit, here formed by the comparators 220, is adapted to be capable of distinguishing between the positive edge and the negative edge of the delayed periodical signal 232 the resolution of the codes generated by the quantization stage, i.e. the DLL in FIG. 5 can again be doubled as the positive edge of the periodical signal may be interpreted as a logic '1', whereas the negative signal may be interpreted as a logic '0', such that the aforementioned set of codes may be generated twice in a single period of the periodical signal, i.e. input clock CLK in FIG. 4, with each code being extended with the clock edge detection bit, such that the full set of codes becomes {00000, 01000, 01100, 01110, 01111, 00111, 00011, 0000$\bar{1}$; 1000$\bar{0}$, 1100$\bar{0}$, 1110$\bar{0}$, 1111$\bar{0}$, 1111$\bar{1}$, $\bar{1}$0111, $\bar{1}$0011, $\bar{1}$0001}. The edge detection bit has been underlined for the sake of clarity, such that an N-bit code can be used to generate 4N codes, thereby reducing the number of required code bits for coding an N-bit bit pattern to $2^{N-2}$.

As previously explained, the further delay circuit of the quantization stage 205 may convert the delayed periodical signal 232 directly into a bit pattern, or alternatively, into a digital code such as a thermometer code. Such a digital code may subsequently be decoded by any suitable decoding stage, such as shown in FIG. 6, which schematically depicts the control of the delay circuit 230 by the analog input signal 100 and the forwarding of the quantized delayed periodical signal, i.e. code bits $b_1$-$b_N$, to the decoding stage 140, which is adapted to produce a bit pattern 150 for further processing, e.g. by a DSP, in response to the received quantized delayed periodical signal 232. A data storage element such as a latch (not shown) may be present between the delay circuit 230 and the decoding stage 140, as previously explained.

The decoding stage 140 may be calibrated in any suitable manner in order to produce the correct bit pattern in response to the code $b_1$-$b_N$ generated by the quantization stage. Such calibration is routine practice for the skilled person, and will therefore not be explained in any further detail for reasons of brevity only.

In accordance with the present invention, an ADC is provided that is capable of producing high-speed analog-to-digital conversions in sub-micron technologies, yet requiring a much smaller area than conventional ADC converters. Although the ADC of the present invention may be utilized in any application, it is foreseen that use of the ADC of the present invention is particularly advantageous in a sigma-delta loop, which does not require high accuracy ADCs, such that even if the ADC of the present invention is provided with respective reference signals for the quantization stage 205 and the delay stage 230 that are noisy or for which the phase relationship is not accurately defined, or other situations in which the error rate of the ADC is higher than expected, the ADC can still be successfully implemented without compromising the performance of the overall integrated circuit.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A circuit for converting an analog input signal into a digital code, comprising:
   a delay circuit configured and arranged to delay an input clock signal and generate a delayed time-varying periodical signal that periodically alters its value and has a delay as a function of an analog input signal value of the analog input signal; and
   a quantization stage configured and arranged to convert the delayed time-varying periodical signal into the digital code by periodically updating a value of the digital code.

2. The circuit of claim 1, further comprising a decoding stage for decoding the digital code into a bit pattern.

3. The circuit of claim 1, wherein the digital code is a thermometer code.

4. The circuit of claim 1, wherein the quantization stage comprises:
   a further delay circuit adapted to receive a further periodical signal having a known phase relationship with the delayed time-varying periodical signal as an input and comprising a plurality of serially connected delay stages each adapted to produce an incrementally delayed version of the further periodical signal; and
   a capture circuit having a plurality of capture stages responsive to the delayed time-varying periodical signal, each capture stage being arranged to receive a respective one of said incrementally delayed versions of the further periodical signal.

5. The circuit of claim 4, wherein the further delay circuit is a delay-locked loop further comprising a phase detector having a first input for receiving the further periodical signal and a second input for receiving the incrementally delayed version of the further periodical signal from the final stage of the plurality of serially connected delay stages, said phase detector being arranged to generate a control signal for controlling the plurality of serially connected delay stages from the phase relationship between the respective signals on its first input and second input.

6. The circuit of claim 5, wherein the delay circuit comprises a chain of delay stages for producing the delayed time-varying periodical signal, each stage being controlled by a further control signal, said further control signal comprising the analog input signal.

7. The circuit of claim 6, wherein the further control signal comprises the control signal modulated by the analog input signal.

8. The circuit of claim 6, wherein the number of delay stages in the delay circuit is half the number of delay stages in the delay locked loop.

9. The circuit of claim 4, wherein the delay locked loop is adapted to delay the further periodical signal by an integer number of periods.

10. The circuit of claim 9, wherein the delay circuit is adapted to delay the periodical signal by the integer number of periods in response to the analog input signal having a maximum value.

11. The circuit of claim 4, wherein each capture stage comprises a comparator for comparing the respective one of said incrementally delayed versions of the further periodical signal with the delayed time-varying periodical signal.

12. The circuit of claim 3, wherein each capture stage comprises a data storage element responsive to the delayed time-varying periodical signal.

13. An electronic device comprising the circuit of claim 1.

14. A method of converting an analog input signal into a digital code, comprising:
    delaying an input clock signal to generate a delayed time-varying periodical signal that periodically alters its value as a function of an analog input signal value of the analog input signal;
    converting the delayed time-varying periodical signal into the digital code by periodically updating a value of the digital code.

15. The method of claim 14, wherein said converting comprises:
    generating a plurality of incrementally delayed versions of a further periodical signal having a known phase relationship with the periodical signal, and
    capturing the generated incrementally delayed versions in response to the delayed time-varying periodical signal.

* * * * *